United States Patent
Okada et al.

(10) Patent No.: US 8,052,810 B2
(45) Date of Patent: Nov. 8, 2011

(54) METAL STRUCTURE AND FABRICATION METHOD THEREOF

(75) Inventors: Kazunori Okada, Hyogo (JP); Yoshihiro Hirata, Hyogo (JP); Shinji Inazawa, Osaka (JP); Masao Sakuta, Itami (JP); Yoshiaki Tani, Amagasaki (JP); Teruhisa Sakata, Amagasaki (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 3 days.

(21) Appl. No.: 12/399,589

(22) Filed: Mar. 6, 2009

(65) Prior Publication Data

US 2009/0176027 A1 Jul. 9, 2009

Related U.S. Application Data

(62) Division of application No. 10/546,824, filed as application No. PCT/JP2004/005228 on Apr. 12, 2004, now abandoned.

(30) Foreign Application Priority Data

Apr. 16, 2003 (JP) ................................. 2003-111710

(51) Int. Cl.
  *C23C 14/00* (2006.01)
  *C22F 1/10* (2006.01)
(52) U.S. Cl. ........................ 148/518; 148/675
(58) Field of Classification Search .............. 205/67–79; 148/518, 675

See application file for complete search history.

(56) References Cited

U.S. PATENT DOCUMENTS

| 2,637,896 | A | * | 5/1953 | Nachtman | 428/655 |
| 3,355,268 | A | * | 11/1967 | Du Rose et al. | 428/649 |
| 3,486,996 | A | * | 12/1969 | Annand | 204/404 |
| 4,021,271 | A | * | 5/1977 | Roberts | 148/551 |
| 4,247,326 | A |   | 1/1981 | Quinto et al. | |

(Continued)

FOREIGN PATENT DOCUMENTS

CN 1058845 2/1992

(Continued)

OTHER PUBLICATIONS

"Next Generation IC Testing Microspring 'Contact Probe' Developed," Sumitomo Electric Industries News Letter, Jan. 2002, pp. 3, No. 292 (w/ English Translation).

(Continued)

*Primary Examiner* — Jessee R. Roe
(74) *Attorney, Agent, or Firm* — McDermott Will & Emery LLP

(57) ABSTRACT

A metal structure according to the present invention is unlikely to become brittle and has excellent hardness and creep resistance, characterized in that annealing has been applied at a temperature not more than the temperature at which crystals of the metal material start to become larger. This metal structure includes at least two kinds of metal material, and annealing can be applied at a temperature not more than the temperature at which crystals of the metal material start to become larger. For example, the present invention is advantageous in the manner of a microstructure for a contact probe. A fabricating method according to the present invention is a method of fabricating a metal structure unlikely to become brittle and having excellent hardness and creep resistance, characterized in that the step of applying annealing at a temperature not more than the temperature at which crystals of the metal material start to become larger is included.

1 Claim, 4 Drawing Sheets

U.S. PATENT DOCUMENTS

| | | | |
|---|---|---|---|
| 4,507,180 A | 3/1985 | van der Werf et al. | |
| 2001/0009724 A1 * | 7/2001 | Chen et al. | 428/607 |
| 2004/0104739 A1 * | 6/2004 | Haga et al. | 324/757 |
| 2005/0028900 A1 | 2/2005 | Chu et al. | |

FOREIGN PATENT DOCUMENTS

| | | |
|---|---|---|
| JP | 56-35758 A | 4/1981 |
| JP | 59-177388 A | 10/1984 |
| JP | 9-35337 A | 2/1997 |
| JP | 10-25594 A | 1/1998 |
| JP | 11-64381 A | 3/1999 |
| JP | 2001-116765 A | 4/2001 |
| JP | 2001-516812 A | 10/2001 |
| JP | 2001-343397 A | 12/2001 |
| JP | 2002-148975 A | 5/2002 |
| JP | 2002-296296 A | 10/2002 |
| TW | 593704 B | 6/2004 |
| WO | WO 99/14404 | 3/1999 |

OTHER PUBLICATIONS

Eiju Takamizawa, "Introduction to Nickel Metallurgy," pp. 548-551, Taiyokaku Limited Partnership Corporation (w/Partial English Translation).

Chinese Office Action for Corresponding Application No. 2004800098112 Mailed Dec. 8, 2006.

Taiwanese Office Action, with English Translation, issued in Taiwanese Patent Application No. TW 093110356, mailed on Jan. 29, 2008.

* cited by examiner

METAL STRUCTURE AND FABRICATION METHOD THEREOF

RELATED APPLICATIONS

This application is a divisional of U.S. application Ser. No. 10/546,824, filed Aug. 24, 2005, now abandoned which is the U.S. National under 35 U.S.C. §371 of International Application No. PCT/JP/2004/005228, filed Apr. 12, 2004, which in turn claims the benefit of Japanese Application No. JP2003-111710 filed Apr. 16, 2003, the entire contents of each of which are hereby incorporated by reference.

TECHNICAL FIELD

The present invention relates to a method of modifying a metal structure, and more particularly, to a method of annealing for fabricating a metal structure unlikely to become brittle and having excellent hardness and creep resistance.

BACKGROUND ART

Annealing is a process to heat a metal structure and the like, hold it at a temperature and then cool the same to lower temperature. It is a heat treatment intended for improvement of plastic working properties, removal of residual internal stress, adjustment of crystal grain and the like. For annealing a metal structure formed of nickel (Ni), the structure is generally heated to around 700-900° C. and held for 1-2 hours, and then cooled down slowly. With this heat treatment, since nickel (Ni) is recrystallized, nanocrystal material of a crystal size of around 10 nm, or amorphous material of a further smaller crystal size, will have a larger crystal size of several μm-several ten μm. The relatively unordered initial structure is reconfigured by annealing, to arrive at a more stable state of equilibrium, and is essentially removed of all residual internal stress.

As an improved annealing method, Japanese Patent National Publication No. 2001-516812 discloses a method of heat treatment to obtain stable machinability under load. In this method, a wire coated with metal such as nickel (Ni) and cobalt (Co) using saccharine and 2-butyne-1,4-diol and the like is relatively mildly heat-treated to fabricate an elastic metal structure.

For a heat treatment temperature of this method, effective is a temperature 0-150° C. higher than the transformation temperature at which crystals of a metal material on the wire become larger. For example, for a wire coated with a metal material including nickel (Ni) and cobalt (Co), the effective temperature for heat treatment is 266-416° C. since the transformation temperature of the metal material is 266° C. (refer to FIG. 6). Therefore, in this method, the structure is heat treated at a temperature lower than the normal annealing temperature for nickel (Ni) of 700-900° C.

For a metal structure including nickel (Ni) and cobalt (Co), when annealing is applied at 330° C. for 10 minutes, nanocrystal material or amorphous material having an average grain diameter of 16 nm will have larger crystals to become crystal material with an average grain diameter of 78 nm. Consequently, due to annealing, yield strength, elastic modulus and temperature stability of the metal structure are modified.

As the semiconductor technology advances, importance of a contact probe, which is necessary to test a circuit formed on a semiconductor substrate or the like, increases. Since the contact probe is pressed against a circuit of a semiconductor substrate or the like for usage, it has a spring capability to increase the reliability of connection with the circuit as well as not to damage the circuit. Therefore, the contact probe is required to have the property of being unlikely to become brittle and damaged while having high hardness. Further, since the contact probe is repeatedly used, it is required to have a property to return to its original shape when load is removed after the test. Thus, it is required for the contact probe that the amount remaining as deformation after load is removed (hereinafter referred to as "creep amount") is small, and that spring load which occurs when the spring achieves a predetermined stroke does not change with loading time. Therefore, it is necessary to use a metal structure having superior creep resistance. More specifically, it is required to maintain creep resistance even when a semiconductor substrate to be tested is at a temperature of around 50-125° C. or higher.

DISCLOSURE OF THE INVENTION

When annealing is applied on a metal structure, excellent quality modifying effects are achieved such as reduction of residual internal stress, increase of hardness and the like. However, depending on conditions of annealing, the metal structure becomes more brittle and has reduced hardness, so that it is more likely to break. One object of the present invention is to provide a method of annealing to fabricate a metal structure unlikely to become brittle and having excellent creep resistance while maintaining hardness.

To achieve the object, a metal structure according to the present invention is a metal structure unlikely to become brittle and having excellent hardness and creep resistance, characterized in that annealing has been applied at a temperature not more than the temperature at which crystals of the metal material start to become larger. This metal structure is formed of at least two kinds of metal material, and annealing can be applied at a temperature not more than the temperature at which crystals of the metal material start to become larger. For example, the present invention is more advantageous in the manner of a microstructure for a contact probe or the like. A method of fabricating a metal structure according to the present invention is a method of fabricating a metal structure unlikely to become brittle and having excellent hardness and creep resistance, characterized in that a step of applying annealing at a temperature not more than the temperature at which crystals of the metal material start to become larger is included.

BEST MODES FOR CARRYING OUT THE INVENTION

Method of Producing a Metal Structure

Figure 1:
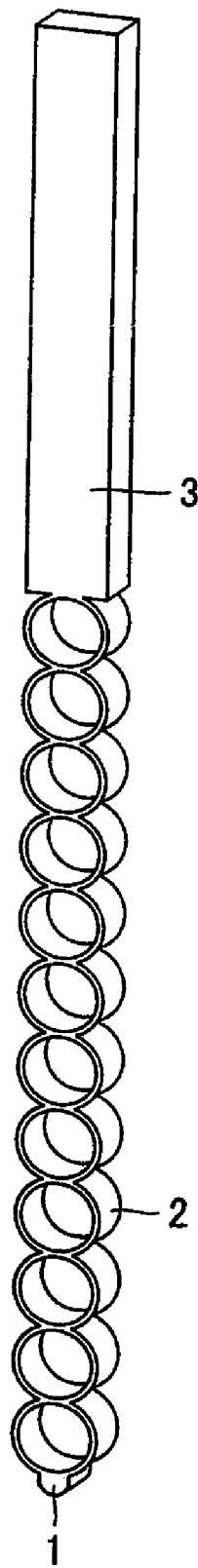
FIG. 1 shows a perspective view of a contact probe according to the present invention.

The method of fabricating a metal structure according to the present invention is characterized in that a step of applying annealing at a temperature not more than the temperature at which crystals of the metal material start to become larger is included. Methods to increase creep resistance of the metal material include a method to reduce residual internal stress within crystals and a method to enlarge the crystal grain size. When heat treatment is applied at a temperature higher than the temperature at which crystals of the metal material increases, residual internal stress within crystals reduces, but crystals become larger at the same time. Consequently, although creep resistance of the metal material increases, decrease in hardness or embrittlement of the metal material tends to occur due to larger crystals. On the other hand, according to the producing method of the present invention which applies annealing at a temperature not more than the temperature at which crystals of the metal material start to become larger, creep resistance increases due to reduction of residual internal stress within crystals while hardness of the metal material is maintained and embrittlement is small because crystals do not enlarge.

Annealing is applied at a temperature not more than the temperature at which crystals of the metal material start to become larger. At a temperature higher than this temperature, decrease in hardness or embrittlement of the metal material is likely to occur. More specifically, if the metal structure includes nickel-manganese (Ni—Mn) alloy, annealing is applied at a temperature not more than 260° C. since the temperature at which crystals start to become larger is 260° C. In this case, since the range of 250-260° C. is a transitional region where some of the crystals start to become larger, the annealing temperature is preferably 150-250° C., and more preferably 200-230° C. When the annealing temperature is lower than 150° C., it is difficult to sufficiently reduce the residual stress within crystals. On the other hand, when the annealing temperature is higher than 250° C., it is possible to reduce internal stress of crystals and increase creep resistance, but decrease in hardness or embrittlement tends to occur.

Although the annealing period of time varies depending on the metal material and annealing temperatures, in general, when annealing is applied at a lower temperature, embrittlement of crystals is depressed and longer annealing time is preferable to reduce residual stress within crystals sufficiently and to prevent crystals from enlarging. Meanwhile, when annealing is applied at a higher temperature, shorter annealing time is preferable to depress enlargement of crystals since it is possible to efficiently reduce residual stress within crystals. For example, when the metal structure is formed of nickel-manganese (Ni—Mn) alloy and the annealing temperature is 150° C., annealing of 10-30 hours is preferable. When the annealing temperature is 250° C., annealing of 0.5-2 hours is preferable.

In the present invention, the metal material to be subjected to annealing is preferably at least one material selected from the group consisting of nickel (Ni), cobalt (Co), iron (Fe), rhodium (Rh), palladium (Pd), tungsten (W), copper (Cu), manganese (Mn), chromium (Cr), titanium (Ti), aluminum (Al), gold (Au) and platinum (Pt). Among these, nickel (Ni), cobalt (Co) or iron (Fe) are more preferable. With regards to alloys, nickel-cobalt (Ni—Co), cobalt-manganese (Co—Mn), nickel-manganese (Ni—Mn), nickel-iron (Ni—Fe), cobalt-iron (Co—Fe), titanium-tungsten (Ti—W) or nickel-cobalt-manganese (Ni—Co—Mn) are more preferable.

(Metal Structure)

The metal structure according to the present invention is characterized in that annealing has been at a temperature not more than the temperature at which crystals of the metal material start to become larger. The metal structure according to the present invention includes at least two kinds of metal material, and annealing can be applied at a temperature not more than the temperature at which crystals of the metal material start to become larger. These metal structures are unlikely to cause decrease in hardness and embrittlement, and have excellent creep resistance. Coating with the metal material can be effected by any of commonly known methods such as electroplating, chemical vapor deposition (CVD), physical vapor deposition (PVD), or electrolytic plating or electroless plating of metal. For example, for physical vapor deposition, vacuum deposition, sputtering or ion plating can be used, and a metal material layer with a thickness of 250-600 nm can be formed by sputtering.

The present invention is more effective for a microstructure. The present invention is also effective for a metal structure which is not a microstructure. However, the effect of making the material itself homogeneous by preventing crystals from enlarging according to the invention is outstanding for a microstructure with a minimum machinable dimension of several μm-several hundred μm. Therefore, the metal structure according to the present invention can be preferably used as a contact probe, since the contact probe needs to have a microstructure of several μm-several hundred μm in its spring portion and the like, and it is necessary to use a material unlikely to become brittle and having excellent hardness and creep resistance.

An example of the contact probe is shown in FIG. 1. The contact probe includes a plunger portion 1 in contact with a circuit to be tested, a spring portion 2 supporting plunger portion 1 at one end, and a lead line connection portion 3 electrically connecting the other end of spring portion 2 to the lead line. The contact probe is arranged within a probe card. When test is conducted, the contact probe is used with plunger portion 1 pressed against a circuit to be tested.

An example of the method of fabricating a contact probe is shown in FIG. 2. As shown in FIG. 2A, a resist layer 22 is formed on a surface of a conductive substrate 21. For a substrate, a conductive substrate of SUS, Cu or Al can be used. Also, a non-conductive substrate can be used which includes Si or glass and the like and has a conductive layer formed thereon of Ti, Al, Cu or alloys thereof by sputtering and the like.

Then, using a mask 23 having a pattern of a desired contact probe, UV or X-ray 24 is directed. Subsequently, an exposed region 22a of resist layer 22 is removed by development, and a resin mold 22b as shown in FIG. 2B is obtained. After resin mold 22b is formed, as shown in FIG. 2C, a metal layer 25 is formed on resin mold 22b. Metal layer 25 can be formed by electroforming. Electroforming means to form a metal layer including nickel (Ni) and the like on a conductive substrate using a metal solution.

After achieving a desired thickness by polishing or grinding, resin mold 22b on substrate 21 is removed by ashing with oxygen plasma and the like, followed by removal of substrate 21 by dry etching and the like. Finally, annealing is applied at a temperature not more than the temperature at which crystals of the metal material start to become larger to obtain a contact probe according to the present invention as shown in FIG. 2D. With this method, a contact probe unlikely to become brittle and having excellent hardness and creep resistance can be fabricated. In addition, a contact probe with its plunger portion, spring portion and lead line connection portion integrated can be easily fabricated, adaptable to micro miniaturization or complexation of the contact probe. Furthermore, assembling work is eliminated.

EXAMPLE 1

Figure 2A:
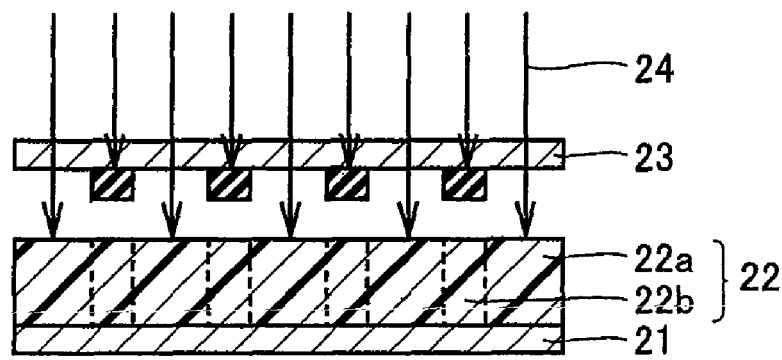
FIGS. 2A-2D show steps in a method of fabricating a contact probe according to the present invention.
Figure 2B:
Figure 2C:
Figure 2D:
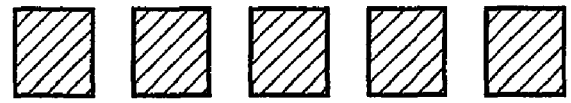
Figure 3:
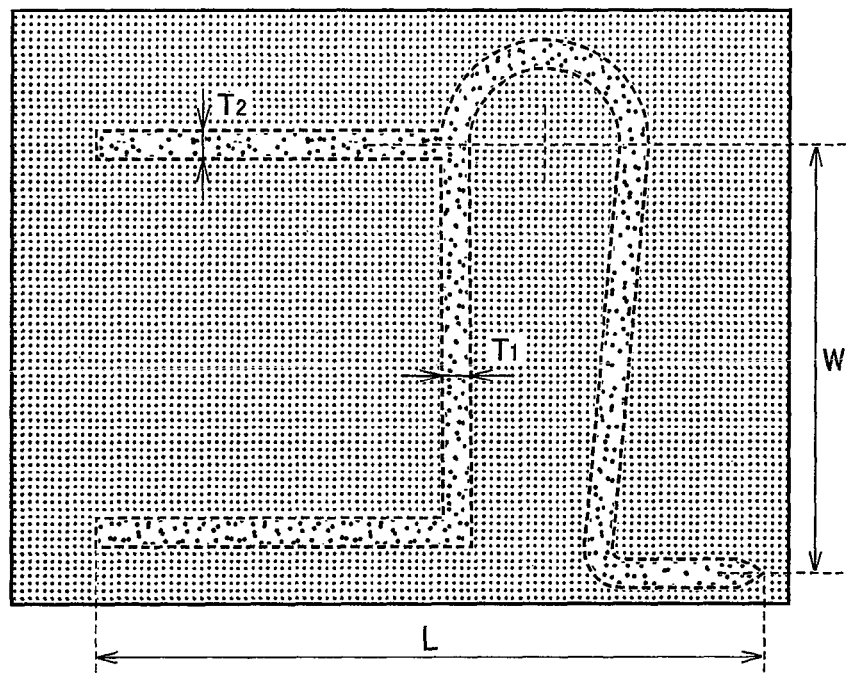
FIG. 3 shows a plan view of a mask having a pattern of a contact probe.

As shown in FIG. 2A, X-ray resist layer 22 was formed on a surface of SUS substrate 21. Then, exposed to X-ray 24 through mask 23 having a pattern of the contact probe, the pattern was transformed to X-ray resist layer 22. The mask corresponding to the pattern of the contact probe had a shape as shown in FIG. 3, with L of 1550 μm, W of 1000 μm, $T_1$ of 82 μm and $T_2$ of 65 μm. Exposed region 22a of resist layer 22 was removed by development to obtain resin mold 22b as shown in FIG. 2B. Then, as shown in FIG. 2C, metal layer 25 of nickel-manganese alloy was formed on resin mold 22b. Formation of metal layer 25 was performed by electroforming. For electroforming, a plating bath having nickel sulfamate solution blended with manganese sulfamate, boric acid, saccharine sodium, 2-butyne-1,4-diol and sodium lauryl sulfate was used.

After electroforming, polishing to a thickness of 60 μm, resin mold 22b was removed by ashing, and substrate 21 was separated to obtain a contact probe as shown in FIG. 2D. When the metal crystal size of the contact probe obtained was measured, it was about 13 nm. Annealing was applied by heating this contact probe within a constant temperature bath held at 200° C. for 1 hour and cooling it down naturally at room temperature. When metal crystal size of the contact probe after annealing was measured, it maintained 13 nm.

Figure 4:
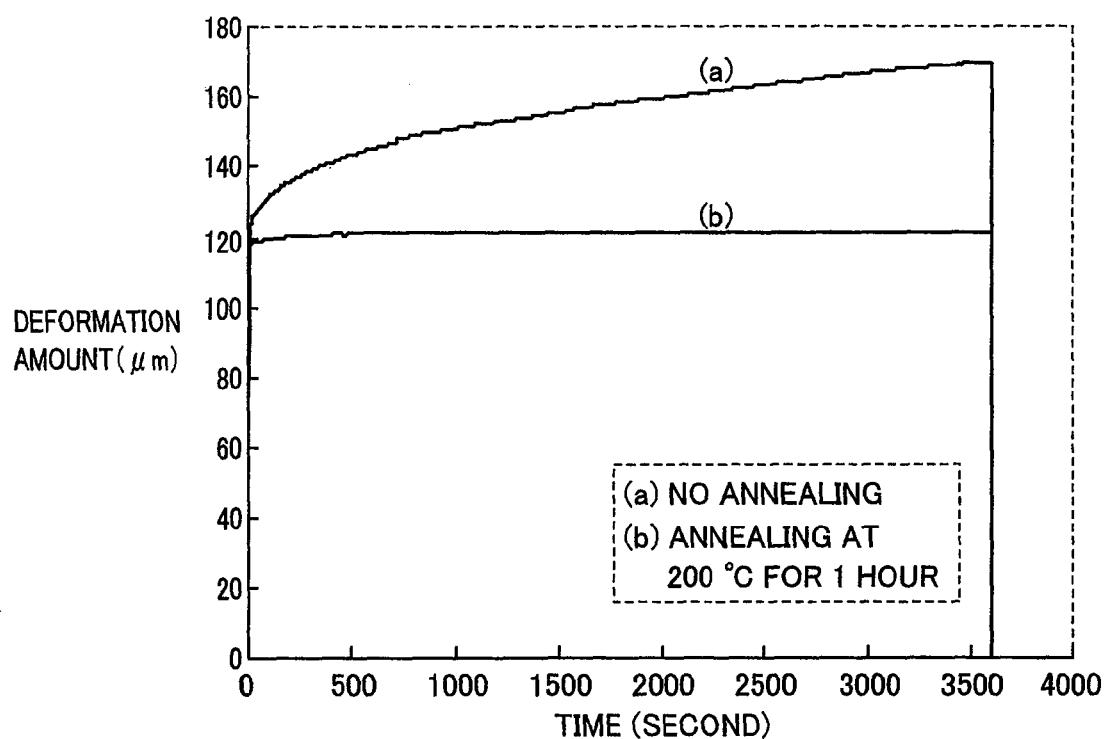
FIGS. 4 and 5 show a deformation amount of a contact probe over time.

Creep resistance of the contact probe was evaluated by a micro load test machine (H-100 produced by Fischer). Evaluation of creep resistance was performed by measuring the deformation amount when the contact probe was subjected to a constant load of 50 mN for 1 hour (3600 seconds) at 85° C. The result is shown in FIG. 4.

Based on the result in FIG. 4, delayed deformation amount was determined by an equation as follows:

Delayed deformation amount (μm)=deformation amount after 1 hour−initial deformation amount As clearly shown from the measurement result, the deformation amount of the contact probe not subjected to annealing gradually increased over time, and after 1 hour of loading, it reached 45 μm. In contrast, in the contact probe subjected to annealing at 200° C. for 1 hour, the initial deformation amount was comparable, but the delayed deformation amount after 1 hour of loading was about 2 μm. Therefore, it was found that the contact probe subjected to annealing according to the present invention did not have enlargement of crystals and showed higher creep resistance than the contact probe not subjected to annealing.

EXAMPLE 2

Figure 5:
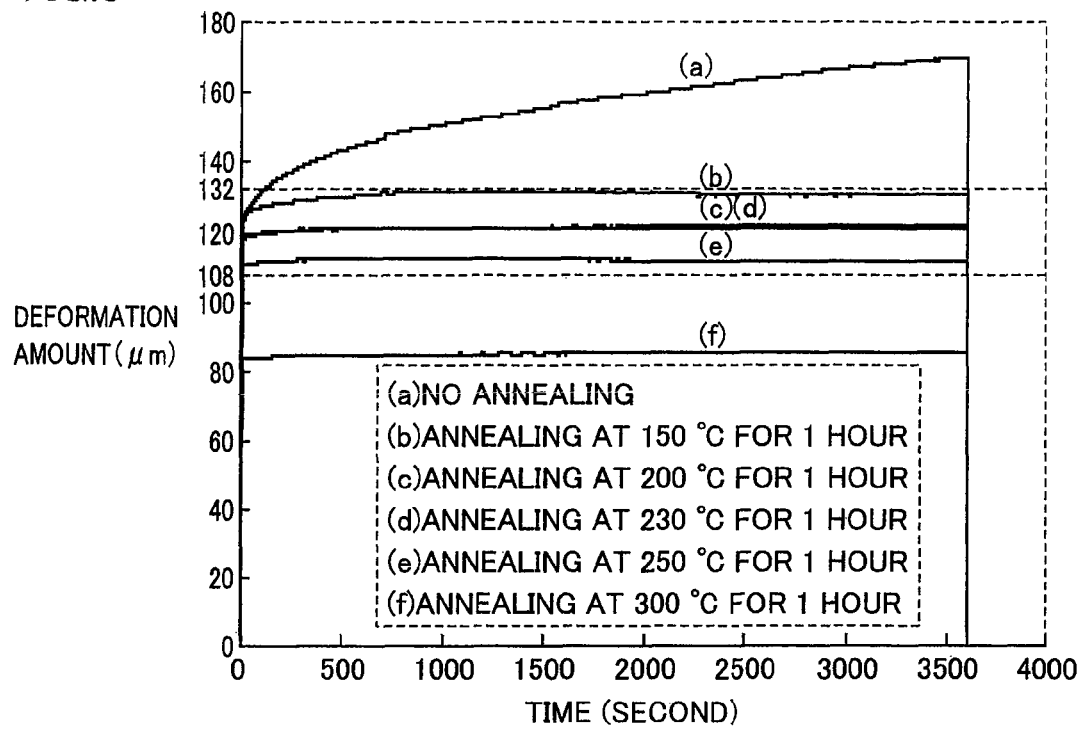

In the present example, for the contact probe produced in Example 1 and before annealing, annealing time was fixed to 1 hour, and annealing was applied at various temperatures of 150° C., 200° C., 230° C., 250° C. and 300° C. Then creep resistance was measured respectively. Evaluation method of creep resistance was the same as in Example 1, and deformation amount after the contact probe was subjected to a constant load of 50 mN for 1 hour (3600 seconds) at 85° C., was measured. The result is shown in FIG. 5.

In the present example, deformation amount (108-132 μm)±10% of the initial deformation amount (120 μm) of the contact probe not subjected to annealing was evaluated as the tolerable range for a product. As clearly shown from the result in FIG. 5, the contact probe subjected to annealing at 150-250° C. for 1 hour was within that tolerable range. Particularly, the contact probe subjected to annealing at the range of 200-230° C. for 1 hour exhibited extremely superior creep resistance. When the annealing temperature was 300° C., although creep resistance was apparently good, the initial deformation amount decreased considerably, and the metal became hard and brittle. Therefore, the contact probe unpreferably often broke when installed or used repeatedly.

EXAMPLE 3

Figure 6:
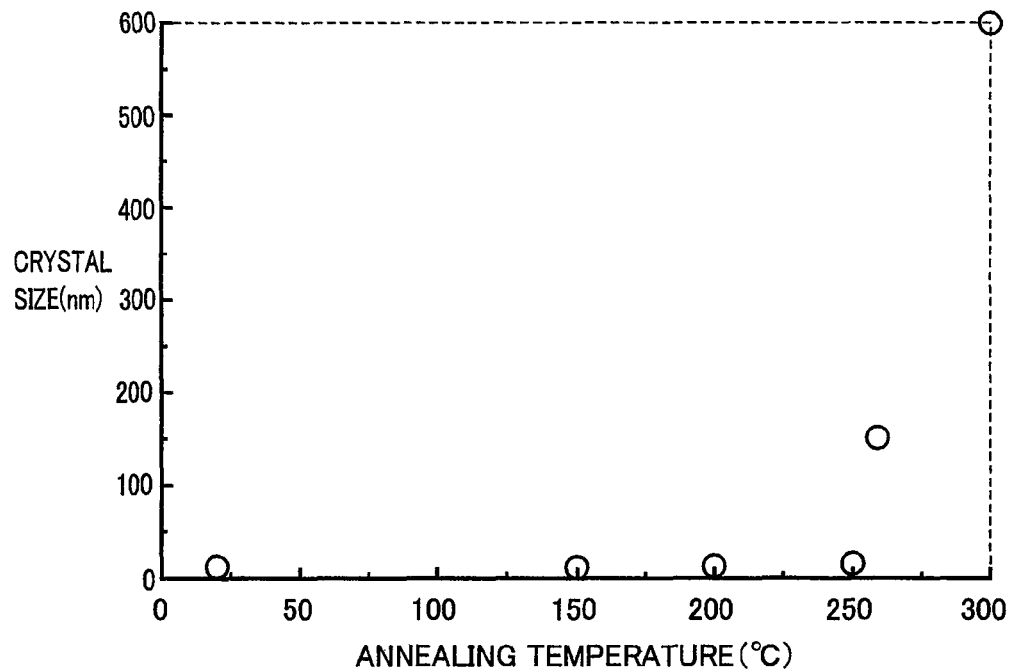
FIG. 6 shows the relationship between annealing temperature and metal crystal size.

In the present example, for the contact probe produced in Example 1 and before annealing, annealing was applied at temperatures of 150° C., 200° C., 250° C., 260° C. and 300° C., and the metal crystal size was measured. The result is shown in FIG. 6. As clearly shown from the result in FIG. 6, with annealing at 250° C., crystals slightly began to grow, and at 260° C., the crystal size became about ten times larger. At 300° C., crystal size reached about 600 nm, showing that crystals completely enlarged. Therefore, it was found that the temperature at which crystals enlarge was 260° C., and also taking into account the result of Example 2, the annealing temperature to effectively exhibit the effects of the present invention was a temperature at which crystals of the metal material start to enlarge, or lower.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

According to the method of annealing of the present invention, a metal structure unlikely to become brittle and having good creep resistance can be fabricated while maintaining hardness.

The invention claimed is:
1. A method of fabricating a metal structure formed of nickel-manganese alloy, wherein said method comprises the steps of electroforming said metal structure, and after electroforming, applying annealing at a temperature of at least 200° C. and not more than 230° C., wherein said metal structure is a contact probe used in electrically testing a circuit.

* * * * *